United States Patent
Pressgrove et al.

(10) Patent No.: US 12,253,573 B2
(45) Date of Patent: Mar. 18, 2025

(54) INTERCONNECT RESISTANCE COMPENSATION FOR CELL VOLTAGE MEASUREMENTS UNDER HIGH CURRENT CONDITIONS

(71) Applicant: Green Cubes Technology, LLC, Kokomo, IN (US)

(72) Inventors: James Robert Pressgrove, Kokomo, IN (US); Raghuram Devanur Chandrashekharaiah, Kokomo, IN (US)

(73) Assignee: Green Cubes Technology, LLC, Kokomo, IN (US)

( * ) Notice: Subject to any disclaimer, the term of this patent is extended or adjusted under 35 U.S.C. 154(b) by 137 days.

(21) Appl. No.: 18/015,122

(22) PCT Filed: Jun. 22, 2021

(86) PCT No.: PCT/US2021/038351
§ 371 (c)(1),
(2) Date: Jan. 9, 2023

(87) PCT Pub. No.: WO2022/010639
PCT Pub. Date: Jan. 13, 2022

(65) Prior Publication Data
US 2023/0258736 A1 Aug. 17, 2023

Related U.S. Application Data

(60) Provisional application No. 63/050,229, filed on Jul. 20, 2020.

(51) Int. Cl.
*G01R 31/396* (2019.01)
*G01R 31/385* (2019.01)
(Continued)

(52) U.S. Cl.
CPC ....... *G01R 31/396* (2019.01); *G01R 31/3865* (2019.01); *G01R 31/389* (2019.01); *G01R 35/005* (2013.01)

(58) Field of Classification Search
None
See application file for complete search history.

(56) References Cited

U.S. PATENT DOCUMENTS

2010/0256936 A1* 10/2010 Darilek ................ G01R 31/382
324/427
2013/0103332 A1 4/2013 Chen et al.
(Continued)

OTHER PUBLICATIONS

Patent Cooperation Treaty (PCT), International Searching Authority, International Search Report, PCT/US2021/038351, Dated Oct. 19, 2021.
(Continued)

*Primary Examiner* — Jas A Sanghera
(74) *Attorney, Agent, or Firm* — Reichel Stohry Dean LLP; Mark C. Reichel; Natalie J. Dean

(57) ABSTRACT

Disclosed herein are batteries, battery packs, systems, and methods for calculating and/or determining, and then compensating for, the voltage loss due to interconnect resistance (IR) between cells of a battery pack. A program may calculate and/or determine the cell IR between each of the cells in a battery pack, which is referred to herein as the "calibration value," and may be determined during the initial battery pack design phase. A program may then multiply the cell IR or "calibration value" by the measured pack current to compensate for the measured cell voltage. The cell IR or "calibration value" may be used during manufacture of the battery pack to compensate for the interconnect resistance (IR) between cells. This compensation for voltage loss due to IR between cells will increase accuracy of the BMS and
(Continued)

improve overall battery pack performance, without increasing material costs or size of the battery pack.

20 Claims, 2 Drawing Sheets

(51) Int. Cl.
*G01R 31/389* (2019.01)
*G01R 35/00* (2006.01)

(56) References Cited

U.S. PATENT DOCUMENTS

| | | |
|---|---|---|
| 2013/0151175 A1 | 6/2013 | Streit |
| 2014/0227571 A1 | 8/2014 | Paganelli et al. |
| 2014/0266222 A1 | 9/2014 | Baughman |
| 2014/0278174 A1* | 9/2014 | Biskup ............... G01R 31/3842 702/65 |
| 2014/0306662 A1 | 10/2014 | Kim et al. |
| 2014/0350877 A1 | 11/2014 | Chow et al. |
| 2017/0113565 A1* | 4/2017 | Lin ......................... B60L 58/12 |
| 2017/0219660 A1 | 8/2017 | Christensen et al. |
| 2019/0181656 A1 | 6/2019 | Cooper et al. |

OTHER PUBLICATIONS

Patent Cooperation Treaty (PCT), International Searching Authority, Written Opinion of the International Searching Authority, PCT/US2021/038351, Dated Oct. 19, 2021.

European Patent Office, Extended European search report and European search opinion, European Application No. EP 21838145.7, Dated Jul. 1, 2024.

* cited by examiner

INTERCONNECT RESISTANCE COMPENSATION FOR CELL VOLTAGE MEASUREMENTS UNDER HIGH CURRENT CONDITIONS

PRIORITY

The present application is related to, and claims the priority benefit of, U.S. Provisional Patent Application Ser. No. 63/050,229, filed Jul. 10, 2020, the contents of which are incorporated herein directly and by reference in their entirety.

BACKGROUND

Typical battery cell monitoring integrated circuits (ICs) use the sense line on the positive terminal of a cell as a reference for monitoring the adjacent cell(s) in the battery. This IC cell monitoring method works well under no current load, or small current load, conditions. However, when the current is high (i.e., charge or discharge current), the cell monitoring IC will be in error by the amount of the current times the resistance (V=I*R) of the interconnect resistance between the cells. As the current increases, the error also increases. As the error increases, the decisions based on cell voltages will be less accurate and this inaccuracy reduces the overall performance of the battery pack.

In the past, this undesirably high cell interconnect resistance has been reduced by either increasing the cross-sectional area (i.e., using a larger cell interconnect wire(s)) and/or by using a material with better conductivity. However, both of these past solutions have resulted in increasing the size of the battery pack (to accommodate the larger cell interconnects) and/or increasing the overall cost of the battery pack. The larger size battery pack and/or more expensive battery packs have been less attractive to both consumers and manufacturers. Thus, it would certainly be desirable to have an improved method for reducing, or compensating for, cell interconnect resistance under high current conditions, without increasing the overall size and/or cost of the battery pack.

BRIEF SUMMARY OF THE INVENTION

The present disclosure includes disclosure of a battery comprising a plurality of electrically interconnected cells, produced by the process of: determining interconnect resistance between the plurality of electrically interconnected cells of the battery during battery design or manufacture, wherein the interconnect resistance is a calibration value; and programming the calibration value into a battery management system (BMS) of the battery to optimize battery performance.

The present disclosure also includes disclosure of a battery produced by the process, wherein the optimized battery performance comprises more accurate compensation for the interconnect resistance between the plurality of cells when the battery is operating under high current conditions.

The present disclosure also includes disclosure of a battery produced by the process, wherein the optimized battery performance comprises compensating for voltage loss due to interconnect resistance between the plurality of cells.

The present disclosure also includes disclosure of a battery produced by the process, wherein the optimized battery performance comprises improved and more accurate battery performance without increasing the battery size.

The present disclosure also includes disclosure of a battery produced by the process, wherein the interconnect resistance is a voltage measured using a sense line coupled to a positive terminal of each of the plurality of cells of the battery.

The present disclosure also includes disclosure of a battery produced by the process, wherein the interconnect resistance between each of the plurality of cells is calculated by subtracting voltage measured at a cell's negative terminal, from voltage measured at a cell's positive terminal.

The present disclosure also includes disclosure of a battery produced by the process, wherein the calibration value is determined by an algorithm to compensate for voltage loss due to interconnect resistance between the plurality of cells in the battery under high current conditions.

The present disclosure also includes disclosure of a battery produced by the process, further comprising manufacturing the battery with the BMS having the programmed calibration value therein.

The present disclosure also includes disclosure of a battery produced by the process, further comprising the step of multiplying the interconnect resistance by measured pack current of the battery to determine the calibration value.

The present disclosure also includes disclosure of a battery produced by the process, further comprising the step of determining a compensation value for each of the plurality of cells during runtime.

The present disclosure includes disclosure of a method of compensating for interconnect resistance between a plurality of electrically coupled cells of a battery: providing a computer having a processor in communication with a storage medium, the storage medium having instructions stored thereon and accessible by the processor, wherein the instructions comprise an algorithm configured to calculate voltage loss measurements due to interconnect resistance between the plurality of electrically coupled cells in the battery, wherein the algorithm performs the steps of: calculating the interconnect resistance between the plurality of electrically coupled cells of the battery during battery design or manufacture; wherein the interconnect resistance is a calibration value; and programming the calibration value into a BMS of the battery at manufacture to optimize battery performance.

The present disclosure also includes disclosure of a method, wherein each of the plurality of electrically coupled cells of the battery each comprise about 3.2 Volts.

The present disclosure also includes disclosure of a method, wherein the interconnect resistance is a voltage measured using a sense line coupled to a positive terminal of each of the plurality of electrically coupled cells of the battery.

The present disclosure also includes disclosure of a method, wherein the optimized battery performance comprises more accurate compensation for the interconnect resistance between the plurality of cells when the battery is operating under high current conditions.

The present disclosure also includes disclosure of a method, wherein the optimized battery performance comprises compensating for voltage loss due to interconnect resistance between the plurality of cells.

The present disclosure also includes disclosure of a method, wherein the optimized battery performance comprises improved and more accurate battery performance without increasing the battery size.

The present disclosure also includes disclosure of a method, further comprising the step of multiplying the interconnect resistance by measured pack current of the battery to determine a calibration value.

The present disclosure also includes disclosure of a method, further comprising the step of determining a compensation value for each of the plurality of cells during runtime.

The present disclosure includes disclosure of a battery having compensation for interconnect resistance between a plurality of cells therein, comprising: a plurality of electrically coupled cells having an interconnect resistance, wherein the interconnect resistance is used as a calibration value; and a battery management system (BMS) having the calibration value programmed therein to compensate for voltage loss due to interconnect resistance between the plurality of cells in the battery under high current conditions.

The present disclosure also includes disclosure of a battery, wherein each of the plurality of electrically coupled cells further comprises a sense line coupled to its positive terminal, and wherein the interconnect resistance is a voltage measured using the sense lines of each of the plurality of electrically coupled cells.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein.

Figure 1:
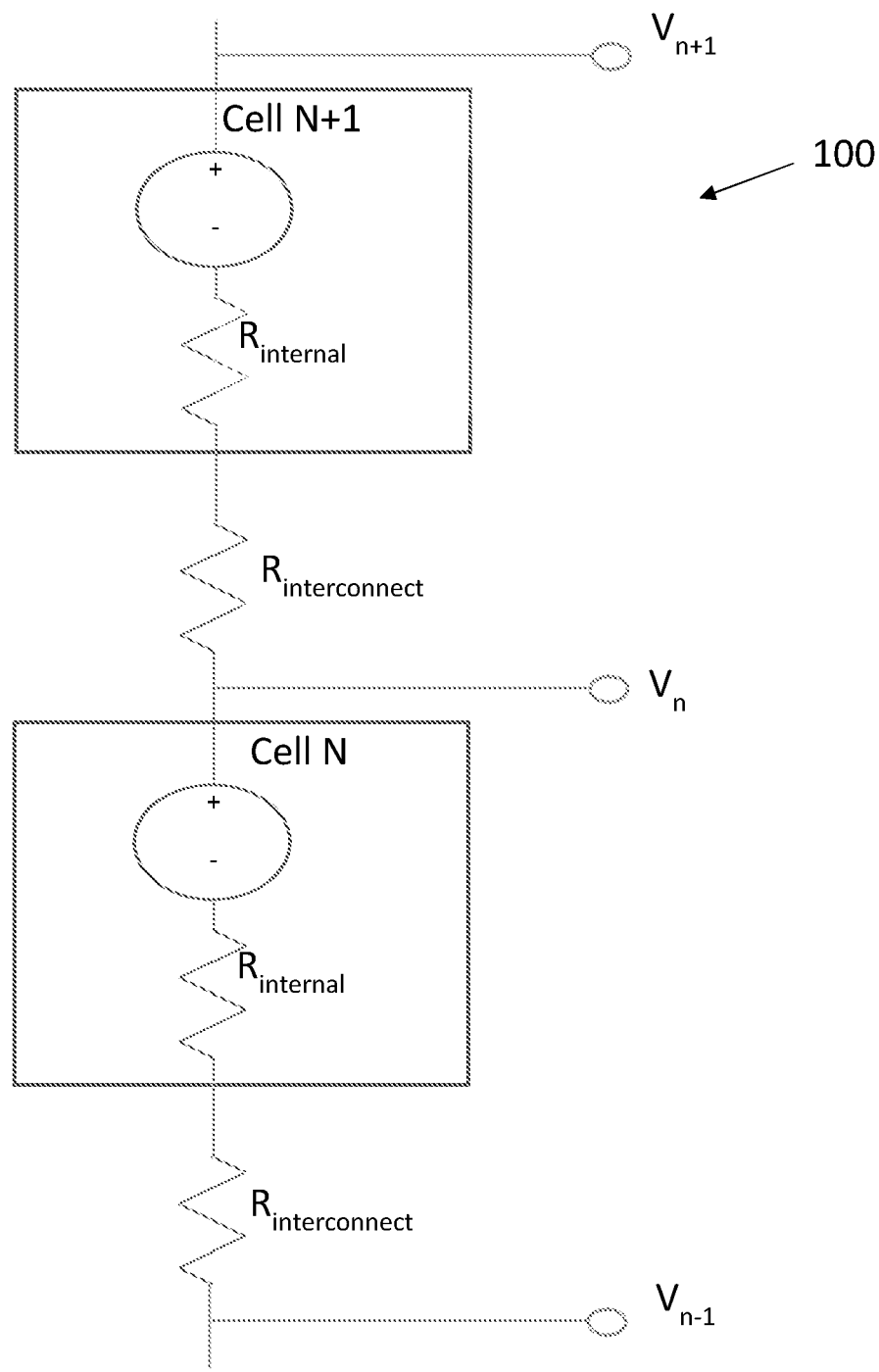
FIG. 1 illustrates an electrical block diagram of a battery pack having multiple cells connected by resistive interconnects, therein.

An overview of the features, functions and/or configurations of the components depicted in the various figures will now be presented. It should be appreciated that not all of the features of the components of the figures are necessarily described. Some of these non-discussed features, such as various couplers, etc., as well as discussed features are inherent from the figures themselves. Other non-discussed features may be inherent in component geometry and/or configuration.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Described herein are devices, programs, systems, and methods of compensating for interconnect resistance between the cells in a battery pack under high current conditions. In a typical battery pack operating under high current conditions, there will be a large error in the cell voltage measurements resulting from the amount of current times the resistance (V=I*R) of the resistive interconnects between the cells. As the current increases, the error increases, thus reducing the overall performance of the battery packs. Disclosed herein are software algorithm programs and methods which may determine, or calculate, and then compensate for, this voltage loss between the cells (due to the interconnect resistance) under high current conditions, thus resulting in improved performance battery packs.

It should be understood that the exemplary battery pack(s) disclosed herein may comprise any number, size, configuration, and/or shape of cells therein. In some embodiments, the battery pack(s) disclosed herein may be lithium batteries and may further comprise, or be coupled to, a battery management system (BMS) and/or cell monitoring integrated circuit (IC) for monitoring and/or operating battery pack(s) and the components therein. These battery pack(s) may be any size, or voltage, and may be comprised of any number of cells and may be controlled, monitored, and/or operated by the BMS, for optimal battery performance. In some embodiments, the BMS may be any type of control logic and/or software and/or integrated circuitry, operable to control, optimize, and/or operate the battery pack(s) herein.

FIG. 1 is an electrical circuit diagram illustrating an exemplary battery pack 100 (also referred to herein as a battery 100 and/or batteries 100, and/or a pack(s) 100) having multiple cells (shown as Cell N+1 and Cell N) electrically coupled together by resistive interconnects (shown as $R_{interconnect}$). The first cell (shown as Cell N+1) is electrically coupled to the second cell (shown as Cell N) via a resistive interconnect (shown as $R_{interconnect}$). While FIG. 1 helps to illustrate the resistive interconnects between cells, and the voltage measurements for the cells, it also helps to highlight the challenge of obtaining accurate cell voltage measurements under high current conditions.

A BMS (not shown) and/or a cell monitoring integrated circuit (IC) may use Cell N as a reference for voltage measurement for adjacent Cell N+1, as shown in FIG. 1. Specifically, the BMS and/or cell monitoring IC (not shown) may use the sense line coupled to the positive terminal of each of the cells (shown as $V_{n+1}$ on Cell N+1, and as $V_n$ on Cell N, etc.) as a reference for determining voltage of the cells. In this way, voltage measured on the positive terminal of Cell N+1 is represented as $V_{n+1}$ (as measured at the sense line). The voltage measured at the positive terminal of Cell N is represented as $V_n$, and the voltage measured at the positive terminal of the next cell in the series (not shown) would be represented by $V_{n-1}$ and so forth. A BMS and/or cell monitoring IC may determine the voltage of Cell N+1 by subtracting $V_n$ from $V_{n+1}$, and may determine the voltage of Cell N by subtracting $V_{n-1}$ from $V_n$, and so forth.

However, as the current through the resistive interconnect ($R_{interconnect}$) increases, the error between the actual voltage of Cell N+1 and the derived voltage ($V_{n+1}-V_n$) also increases, thus providing less accurate voltage calculations under high current conditions. Previous solutions to this problem have focused on either increasing the cross-sectional area of the resistive interconnect and/or using a material with better conductivity. However, both of these previous solutions resulted in higher costs and/or larger battery pack 100 size. It would thus be desirable to implement a solution to determine and compensate for the voltage loss (due to interconnect resistance between cells) under high current conditions without increasing the costs and/or size of the battery pack 100.

In a first embodiment, a software algorithm, computer program, or other program instructions, computer and/or method (referred to herein below as a 'software program') may calculate or determine, and then compensate for, the voltage loss due to interconnect resistance (IR) between cells (Cell N+1 and Cell N) of the battery 100. The software program may calculate/determine the cell interconnect resistance (IR) between each of the cells in a battery pack 100. This cell interconnect resistance (IR) between each of the cells is also referred to herein as the "calibration value," and may be determined during the initial battery design phase. For example, if there are 16 cells in a battery pack 100, then there are 16 interconnect resistance (IR) values. In some embodiments, the software program may then multiply the cell interconnect resistance (IR) or "calibration value" by the measured pack current (i.e., total battery pack 100 current) to then compensate for the measured cell voltage.

The cell interconnect resistance (IR) or "calibration value" may be used during (or prior to) manufacture of the battery 100, such as by programming (or pre-programming) the "calibration value" into the BMS of a battery pack 100 to compensate for the interconnect resistance (IR) between cells. The software program may be designed such that the individual cell interconnect resistances (IR) can be calibrated at the initial battery 100 design phase, thus allowing for compensation of cell interconnect resistance (IR) between the individual cells in a battery 100 to be built-in, or pre-programmed, into the BMS of a battery 100 at the time of manufacture. This compensation for the voltage loss due to interconnect resistance (IR) between cells will increase the accuracy of the BMS and improve overall battery 100 performance, without increasing material costs or size of the battery 100.

In one exemplary embodiment, the cells (Cell N+1 and Cell N) of an exemplary battery 100 may each comprise 3.2 Volts, electrically coupled together by resistance interconnects, or wires, such as a 25.4 mm×2.54 mm bus bar, for example.

Figure 2:
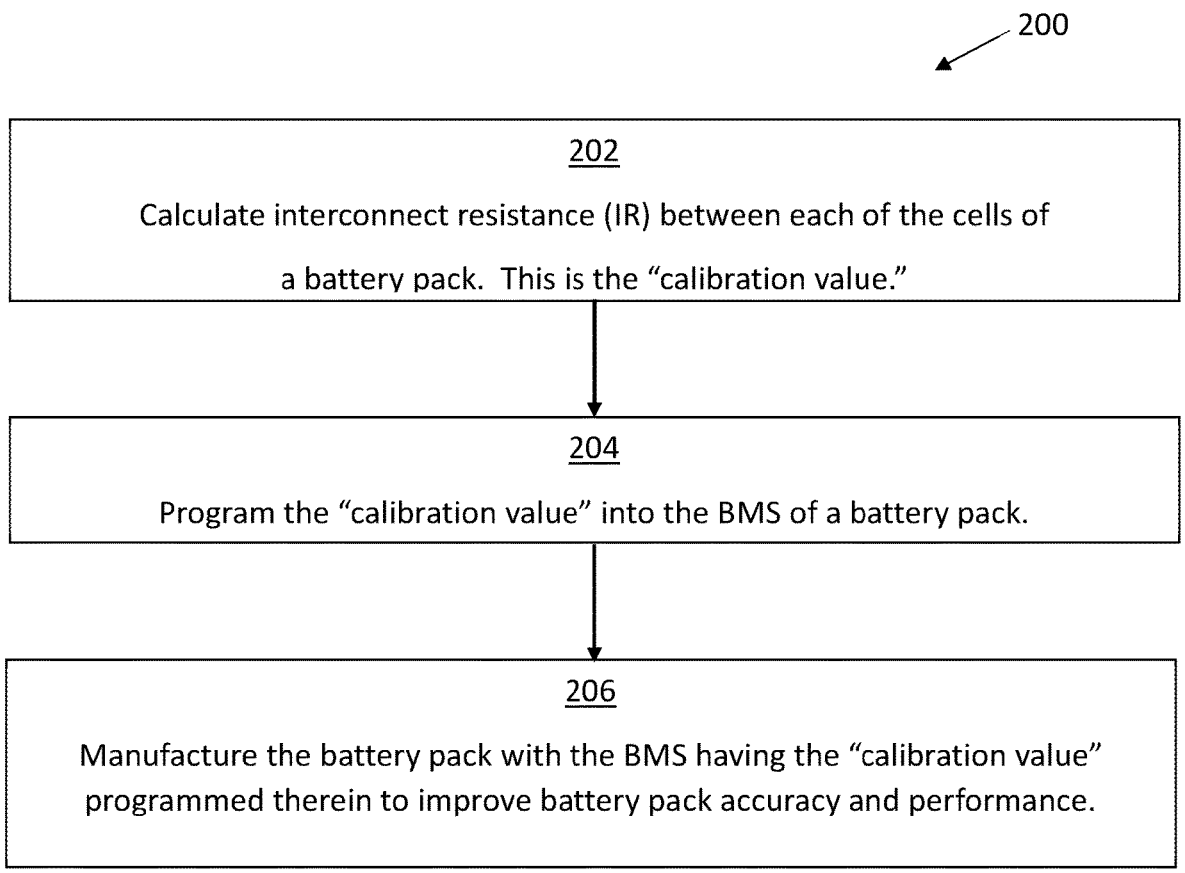
FIG. 2 illustrates an exemplary flowchart of steps for compensating for interconnect resistance between the cells in a battery pack to manufacture a battery pack having improved performance and accuracy.

In one exemplary embodiment of operation, an exemplary flowchart or method 200 of steps for compensating for interconnect resistance (IR) between the cells in a battery pack 100 is shown in FIG. 2 and as follows:

1. Calculate 202 interconnect resistance (IR) between each of the cells of a battery pack 100. (This is the "calibration value" and this may be calculated during initial battery 100 design phase.)
2. Program 204 the "calibration value" into the BMS of a battery pack 100. (This "calibration value" is used to compensate for the voltage loss due to interconnect resistance (IR) between the cells in the battery pack 100.)
3. Manufacture 206 the battery pack 100 with the BMS having the "calibration value" programmed therein to improve accuracy and performance of the battery pack 100.

Additionally, in one exemplary embodiment, a "compensation value" may also be computed during runtime for each cell in a battery pack 100. In this embodiment, the BMS may compensate for the Interconnect Resistance (IR) Loss during runtime based on the programmed "calibration value" as per the bellow operation/method:

---
During Charge:
    IF IR Compensation is enabled THEN
    For each Cell
        Cell Voltage Compensated = Cell Voltage Read −
        (Pack Current * calibration value configured for the cell)
    ELSE
        Cell Voltage Compensated = Cell Voltage Read During Discharge:
    IF IR Compensation is enabled THEN
    For each Cell
---

-continued

---
        Cell Voltage Compensated = Cell Voltage Read +
        (Pack Current * calibration value configured for the cell)
    ELSE
        Cell Voltage Compensated = Cell Voltage Read
---

In view of the foregoing, it is noted that the present disclosure contains disclosure of batteries 100, said batteries comprising a plurality of cells (such as cell N+1, cell N, cell N−1, and so forth), whereby each cell is connected to its adjacent cell via a resistive interconnect ($R_{interconnect}$). Said batteries 100 can comprise any number of cells, such as two, three, four, five, six, or more cells, with adjacent resistive interconnects. As such, the present disclosure includes disclosure of cells configured for interconnection as referenced herein, disclosure of batteries comprising said cells, disclosure of software/programs (such as those configured to "run" on a computer, namely via a processor accessing said software/programs (also referred to as "instructions") saved within a storage medium), and disclosure of methods to connect said cells, to obtain resistance data, to calculate information based upon obtained data, to produce batteries, and to use said cells and batteries.

While various embodiments of methods and systems for interconnect resistance compensation of cell voltage measurements under high current conditions have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A method of compensating for interconnect resistance between a plurality of electrically coupled cells of a battery:
    providing a computer having a processor in communication with a storage medium, the storage medium having instructions stored thereon and accessible by the processor, wherein the instructions comprise an algorithm configured to calculate voltage loss measurements due to interconnect resistance between the plurality of electrically coupled cells in the battery, wherein the algorithm performs the steps of:
    calculating the interconnect resistance between the plurality of electrically coupled cells of the battery during an initial battery design phase;
    wherein the interconnect resistance is a calibration value; and
    programming the calibration value into a BMS of the battery at manufacture to optimize battery performance.

2. The method of claim 1, wherein each of the plurality of electrically coupled cells of the battery each comprise about 3.2 Volts.

3. The method of claim 1, wherein the interconnect resistance is a voltage measured using a sense line coupled to a positive terminal of each of the plurality of electrically coupled cells of the battery.

4. The method of claim 1, wherein the optimized battery performance comprises more accurate compensation for the interconnect resistance between the plurality of cells when the battery is operating under high current conditions.

5. The method of claim 1, wherein the optimized battery performance comprises compensating for voltage loss due to interconnect resistance between the plurality of cells.

6. The method of claim 1, wherein the optimized battery performance comprises improved and more accurate battery performance without increasing the battery size.

7. The method of claim 1, further comprising the step of multiplying the interconnect resistance by measured pack current of the battery to determine a calibration value.

8. The method of claim 1, further comprising the step of determining a compensation value for each of the plurality of cells during runtime.

9. A battery comprising a plurality of electrically interconnected cells, produced by the process of:
    connecting the plurality of cells such that the plurality of cells are connected via resistive interconnects each having an interconnect resistance;
    wherein a derived voltage of any connected cell of the plurality of cells is derived by comparing the voltage measured at a positive terminal of the connected cell and the voltage measured at a positive terminal of a cell adjacent to the connected cell, wherein the connected cell and the cell adjacent to the connected cell have a shared resistive interconnect between them;
    wherein the interconnect resistance of the resistive interconnects causes the derived voltage of the cells to be inaccurate under high current conditions;
    determining each of the interconnect resistances of the resistive interconnects during an initial battery design phase, wherein the interconnect resistances are calibration values; and
    programming the calibration values into the battery management system (BMS) of the battery such that the BMS uses the calibration values to compensate for the voltage loss due to the interconnect resistances of the resistive interconnects under high current conditions and determine an accurate derived voltage of each of the plurality of cells under high current conditions thereby optimizing battery performance.

10. The battery produced by the process of claim 9, further comprising the step of manufacturing the battery comprising the plurality of electrically interconnected cells and the programmed BMS.

11. The battery produced by the process of claim 9, further comprising:
    using a sense line connected to a positive terminal of each of the plurality of cells to measure the voltage at each cell;
    wherein the derived voltage of any connected cell of the plurality of cells is derived by comparing the voltage measured by the sense line connected to the positive terminal of the connected cell and the voltage measured by the sense line connected to the positive terminal of a cell adjacent to the connected cell, wherein the connected cell and the cell adjacent to the connected cell have a shared resistive interconnect between them.

12. The battery produced by the process of claim 9, wherein the plurality of cells are connected in series.

13. The battery produced by the process of claim 9, further comprising the step of multiplying the interconnect resistance by a measured pack current of the battery to determine the calibration value.

14. The battery produced by the process of claim 9, further comprising the step of determining a compensation value for each of the plurality of cells during runtime.

15. A battery comprising a plurality of electrically interconnected cells, produced by the process of:
    electrically connecting a first cell to a second cell via a resistive interconnect;
    using a first sense line connected to a positive terminal of the first cell and a second sense line connected to a positive terminal of the second cell to measure the voltages at the first cell and at the second cell;
    wherein an interconnect resistance of the resistive interconnect causes a derived voltage of the first cell, which is derived from the voltages measured by the first sense line and the second sense line, to be inaccurate under high current conditions;
    determining the interconnect resistance of the resistive interconnect between the first cell and the second cell during an initial battery design phase, wherein the interconnect resistance is a calibration value;
    programming the calibration value into a battery management system (BMS) of the battery to compensate for the voltage loss due to interconnect resistance of the resistive interconnect under high current conditions such that the BMS uses the calibration value to determine an accurate derived voltage of the first cell under high current conditions thereby optimizing battery performance; and
    manufacturing the battery comprising the first cell, the second cell, and the programmed BMS.

16. The battery produced by the process of claim 15, wherein the first cell and the second cell are connected in series.

17. The battery produced by the process of claim 15, wherein the derived voltage of the first cell is determined by subtracting the measured voltage of the second cell from the measured voltage of the first cell.

18. The battery produced by the process of claim 15, further comprising the steps of:
    connecting a third cell to a second cell via a second resistive interconnect;
    using a third sense line connected to a positive terminal of the third cell to measure the voltage of the third cell;
    wherein a second interconnect resistance of the second resistive interconnect causes a derived voltage of the second cell, which is derived from the voltages measured by the second sense line and the third sense line, to be inaccurate under high current conditions;
    determining the second interconnect resistance of the second resistive interconnect between the first cell and the second cell, wherein the interconnect resistance of the second resistive interconnect is a second calibration value; and
    programming the second calibration value into the BMS of the battery to compensate for the voltage loss due to the second interconnect resistance of the second resistive interconnect under high current conditions such that the BMS can use the second calibration value to determine an accurate derived voltage of the second cell under high current conditions thereby optimizing battery performance.

19. The battery produced by the process of claim 18, wherein the derived voltage of the second cell is determined by subtracting the measured voltage of the third cell from the measured voltage of the second cell.

20. The battery produced by the process of claim 18, wherein the third cell and the second cell are connected in series.

* * * * *